US007112524B2

(12) United States Patent
Hsu et al.

(10) Patent No.: US 7,112,524 B2
(45) Date of Patent: Sep. 26, 2006

(54) SUBSTRATE FOR PRE-SOLDERING MATERIAL AND FABRICATION METHOD THEREOF

(75) Inventors: Shih-Ping Hsu, Hsin-chu (TW); Chu-Chin Hu, Hsin-chu (TW)

(73) Assignee: Phoenix Precision Technology Corporation, (TW)

( * ) Notice: Subject to any disclaimer, the term of this patent is extended or adjusted under 35 U.S.C. 154(b) by 70 days.

(21) Appl. No.: 10/769,451

(22) Filed: Jan. 29, 2004

(65) Prior Publication Data
US 2005/0070084 A1    Mar. 31, 2005

(30) Foreign Application Priority Data
Sep. 29, 2003 (TW) ............... 92126790 A
Sep. 29, 2003 (TW) ............... 92126792 A (51) Int. Cl.
*H01L 21/44* (2006.01)
(52) U.S. Cl. ............ 438/614; 438/108; 438/674; 438/652
(58) Field of Classification Search ............... 438/613, 438/614, 675, 692, 108; 257/E23.119, E23.12, 257/E23.121
See application file for complete search history.

(56) References Cited

U.S. PATENT DOCUMENTS

| 5,592,025 A * | 1/1997 | Clark et al. ............... 257/774 |
| 2002/0092894 A1* | 7/2002 | Wang et al. ............ 228/180.22 |
| 2003/0001240 A1* | 1/2003 | Whitehair et al. .......... 257/638 |
| 2004/0166617 A1* | 8/2004 | Moriizumi et al. ......... 438/197 |

* cited by examiner

*Primary Examiner*—George R. Fourson
*Assistant Examiner*—John M. Parker
(74) *Attorney, Agent, or Firm*—Fulbright & Jaworski L.L.P.

(57) ABSTRACT

A substrate for a pre-soldering material and a fabrication method of the substrate are proposed. The substrate having at least one surface formed with a plurality of conductive pads is provided. An insulating layer is formed over the surface of the substrate in such a way that a top surface of each of the conductive pads is exposed. Next, a conductive film and a resist layer are formed in sequence on the insulating layer and the conductive pads, wherein a plurality of openings are formed in the resist layer to expose a part of the conductive film above the conductive pad. Then, a pre-soldering material is deposited over the conductive pad by stencil printing or electroplating process.

3 Claims, 10 Drawing Sheets

SUBSTRATE FOR PRE-SOLDERING MATERIAL AND FABRICATION METHOD THEREOF

BACKGROUND OF THE INVENTION

1. Field of the Invention

The invention relates to substrates for pre-soldering materials and fabrication methods thereof, and more particularly, to a substrate having exposed conductive pads thereon for use with a pre-soldering material applied by electroplating or stencil printing process and a fabrication method of the substrate.

2. Description of the Related Art

In the early 60, IBM has introduced a flip chip package technology characterized by having solder bumps to connect the semiconductor chip and the substrate, instead of having the gold wire as in the typical wire bonding technique. The flip chip package technology has benefits in terms of increasing package integration, and reducing package device size, while a long metal wire is not required in the flip chip package technology in order to enhance electrical function of the device. For many years, manufacturers have adopted a thermal soldering on the ceramic substrate in a technology known as control-collapse chip connection (C4). Recently, the demand for the semiconductor device of high density, high speed, and low cost is increased, the flip-chip device is mounted on a low-cost organic circuit board (such as printed circuit board (PCB) or substrate) to meet the trend for gradually minimizing the size of the electrical product. Then, the underfill resin is filled underneath the chip to reduce the thermal stress generated due to a difference in thermal expansion between the silicon chip and the organic circuit board.

In the current flip chip package technology, a plurality of conductive electrode pads are disposed on the integrated circuit (IC) chip, while corresponding conductive pads are disposed on the organic circuit board, such that the soldering bumps or other conductive adhesive materials are suitably disposed between the chip and the circuit board. The chip is mounted by electrical contacts on the circuit board in a face-down manner, wherein the soldering bumps or the conductive adhesive materials provide conductive input/output and mechanical connection between the chip and the circuit board.

Figure 1A:
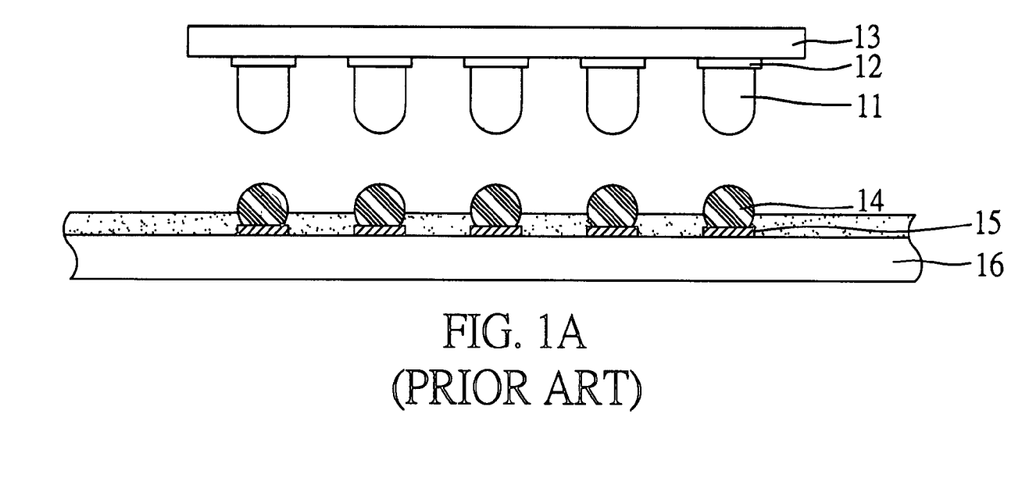
FIGS. 1A and 1B (PRIOR ART) are schematic cross-sectional views of a conventional method for fabricating a flip chip semiconductor device.
Figure 1B:
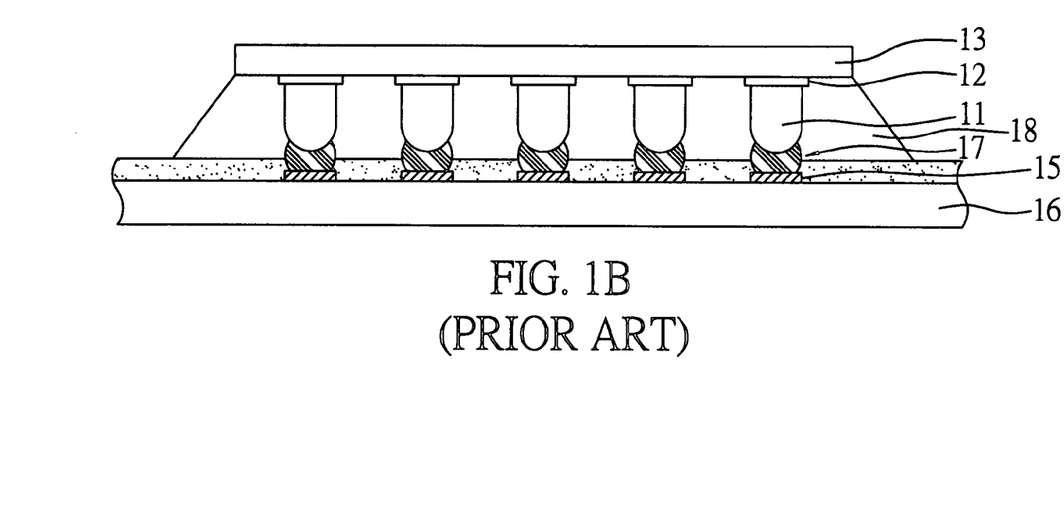

Referring to FIGS. 1A and 1B, a conventional flip-chip device is proposed. As shown in the diagram, a plurality of metal bumps 11 are formed on electrode pads 12 of the chip 13, and a plurality of pre-soldering bumps 14 made of soldering material are formed on the conductive pads 15 of the organic circuit board 16. At a re-flow soldering temperature sufficient to melt the pre-soldering material, the pre-soldering bumps 14 are re-flow soldered to corresponding metal bumps to form soldering connections 17. For the solder bump joint, a gap between the chip and the circuit board is further filled with an underfill material 18 to eliminate thermal expansion difference between the chip 13 and the circuit board 16 and the stress of the soldering connections 17.

Figure 2:
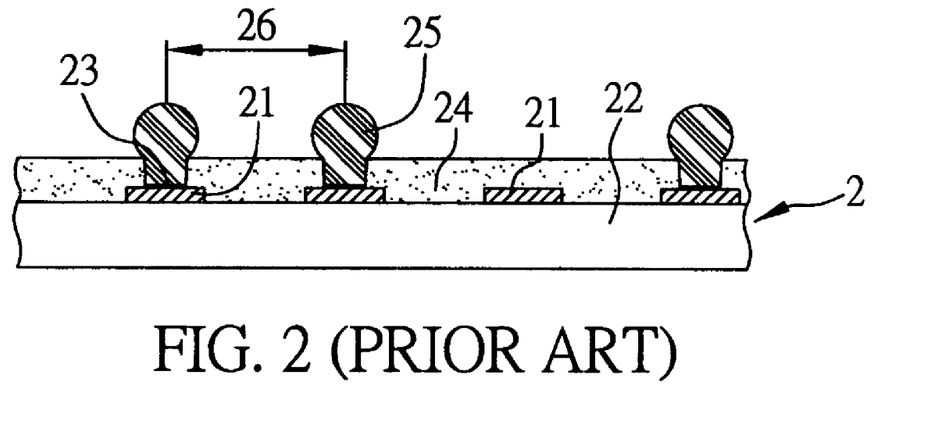
FIG. 2 (PRIOR ART) is a schematic cross-sectional view of a conventional circuit board having an insulating layer and pre-soldering bumps.

FIG. 2 illustrates a conventional organic circuit board 2 used in the flip-chip package, wherein the circuit board 2 has conductive pads 21. The insulating layer 22 of the organic circuit board 2 is made of organic material, mix fiber organic material, or mix grain organic material (compound materials such as epoxy, polyimide, bismeleimide triazine, cyanate ester, polybenzocyclobutane or their glass fibers). The conductive pads 21 are typically made of metallic material (such as copper). The common metal barrier layer 23 includes a nickel adhesive layer formed on the conductive pads 21 and a gold (Au) insulating layer formed on the nickel adhesive layer. The barrier layer 23 also includes gold (Au), nickel (Ni), palladium (Pd), silver (Ag), tin (Sn), Ni/Pd, chromium (Cr)/titanium (Ti), Pd/Au, or Ni/Pd/Au formed by electroplating, electroless plating, or physical vapor deposition. Next, an organic insulating layer 24, such as a layer of green paint is coated on the surface of the circuit board 2 to protect the wire layer above the circuit board while providing an insulating property.

As shown in FIG. 2, the conductive pads 21 are exposed from the organic insulating layer 24, and pre-soldering bumps 25 are formed on the conductive pads 21 to subsequently form flip-chip soldering joints. Currently, the stencil printing process is adopted by most of current manufacturers to deposit the solder on the conductive pads 21 so as to form the pre-soldering bumps. And the molding plate material most commonly seen in the stencil printing is a steel plate.

However, as the current development for telecommunication, network, computer, and a variety of portable products grows significantly in the actual operation, packages that enable minimization of IC area and characterized by having high density and multiple leads, such as ball grid array (BGA) package, flip chip package, chip scale package (CSP), and multi chip module (MCM) have gradually become main trend in the package market. And these packages often cooperate with the microprocessor, chip module, graphic chip, ASIC, and other highly efficient chips to achieve higher operation speed. However, as it is necessary to scale down the wire width and conductive pad, a part of area of the conductive pad 21 may be covered by the insulating layer 24 that is present between the conductive pads 21 as the pitch of the conductive pad 26 is constantly reduced, making the conductive pads 21 exposed from the insulating layer 24 even smaller. This causes misalignment for the pre-soldering bumps formed subsequently, while size of the opening in the molding plate is minimized in the stencil printing technique as a result of the space occupied by the insulating layer 24 and the height thereof. As it is not easy to mold the molding plate, the cost for fabricating the molding plate is increased. Furthermore, it is very difficult for the pre-soldering material to penetrate through the openings with the very small pitches in the molding plate. Thus, this results a bottleneck for the fabrication process.

The insulating layer 24 that covers a part of the area of the conductive pad 21 occupies space and is formed with a height, leading to an increase in amount of pre-soldering material being used as well as an increase in corresponding thickness for semiconductor substrate. As a result, the fabrication cost is increased and minimization of the semiconductor device is adversely affected. And while the pre-soldering is electroplated in the opening area of the insulating layer 24, the bond joint for the pre-soldering material is poor and unable to pass the reliability test due to a limited contact area for forming the pre-soldering material on the conductive pads.

Therefore, the above-mentioned problems associated with the prior arts are resolved by providing a substrate formed with pre-soldering material to improve problems, such as misalignment for pre-soldering material, poor bond joint, and low yield of stencil printing technique.

SUMMARY OF THE INVENTION

In light of the drawbacks above, the primary objective of the present invention is to provide a substrate for a pre-soldering material and a method for fabricating the same, whereby a top surface of a conductive pad is exposed on the substrate, so that a large surface area of the conductive pad is provided for forming the pre-soldering material.

Another objective of the present invention is to provide a substrate for a pre-soldering material and a method for fabricating the same, whereby a contact area between the conductive pads and the deposited soldering material is increased to strengthen pre-soldering joint.

A further objective of the present invention is to provide a substrate for a pre-soldering material and a method for fabricating the same so as to prevent reduction of the conductive pad area exposed by the insulating layer. As a result, this resolves subsequent bump alignment problem and difficulty in depositing the pre-soldering material on the conductive pads.

In accordance with the above and other objectives, the present invention proposes a method for fabricating a substrate for a pre-soldering material. The method comprises the steps of providing a substrate having at least one surface formed with a plurality of conductive pads; forming an insulating layer over the substrate; and removing a portion of the insulating layer so that a top surface of each of the conductive pads is exposed.

Subsequently, a conductive film and a resist layer are formed in sequence on the insulating layer and the conductive pads, and a plurality of openings are formed in the resist layer to expose a part of the conductive film above the conductive pads. Next, an electroplating step is performed to deposit pre-soldering material over the conductive pads of the substrate. Alternatively, a stencil printing step is performed to deposit pre-soldering material over the conductive pads of the substrate. Then, a re-flow soldering step is performed to form solder bumps on the conductive pads.

With the method described above, a substrate for forming pre-soldering material is fabricated. The substrate comprises a substrate having at least one surface formed with a plurality of conductive pads, and an insulating layer formed over the substrate in such a way that the insulating layer adhere to a periphery of the conductive pad so that an upper surface of the conductive pad is exposed. Then, by stencil printing or electroplating, a pre-soldering material is then formed over the upper surface of the conductive pad.

In contrast to the conventional method, the upper surface of the conductive pad is exposed from the insulating layer in the present invention. Therefore, a larger area of the conductive pad is provided for forming the pre-soldering material. Without forming the insulating layer to occupy space which is between chip and its package substrate, the present invention can reduce the amount of pre-soldering material required as well as the thickness of the package substrate, making the semiconductor package lighter and more compact, while the fabrication cost is minimized. And as the contact area between the conductive pads and the deposited pre-soldering material is increased, the bonding strength for the pre-soldering material is enhanced.

To provide a further understanding of the invention, the following detailed description illustrates embodiments and examples of the invention, it is to be understood that this detailed description is being provided only for illustration of the invention and not as limiting the scope of this invention.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

A substrate for pre-soldering material and a fabrication method thereof are illustrated in the diagrams below. It should be noted here that the diagrams below are schematic diagrams illustrating only basic construction of the present invention, and only components relevant to the present invention are illustrated. So, the actual layout for the components can be more complicated in terms of their number, shape, and ratio.

Figure 3A:
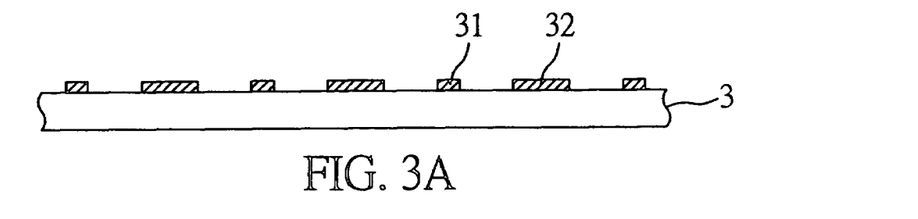
FIGS. 3A through to 3I are schematic cross-sectional views illustrating a method for fabricating a substrate for a pre-soldering material according to the present invention.

FIGS. 3A through to 3I are schematic cross-sectional diagrams illustrating method for fabricating the substrate formed with pre-soldering material according to one preferred embodiment of the present invention.

Referring to FIG. 3A, a substrate 3 is provided. The substrate 3 has a surface formed with a plurality of conductive pads 32. A plurality of conductive traces 31 may also be formed on the surface of the substrate to electrically connect with the conductive pads 32. As the method for forming the conductive pads and conductive traces is well known to those skilled in the art, further details thereof are omitted herein.

Figure 3B:
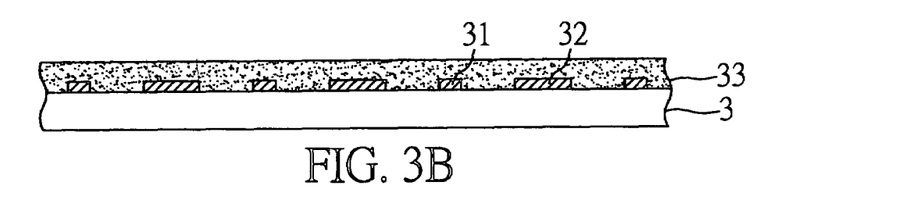

Referring to FIG. 3B, an insulating layer 33 is formed by printing, spin-coating, or adhering over substrate 3 formed with the conductive pads 32. Preferably, the insulating layer 33 may be a solder mask layer, such as a layer of green paint.

Figure 3C:
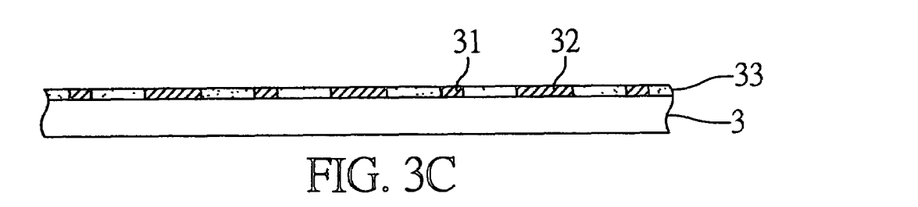

Referring to FIG. 3C, a portion of the insulating layer 33 is removed by thinning technology such as a polishing method to expose a top surface of each of the conductive pads 32, so as to obtain the semiconductor substrate for forming pre-soldering material.

Figure 3D:
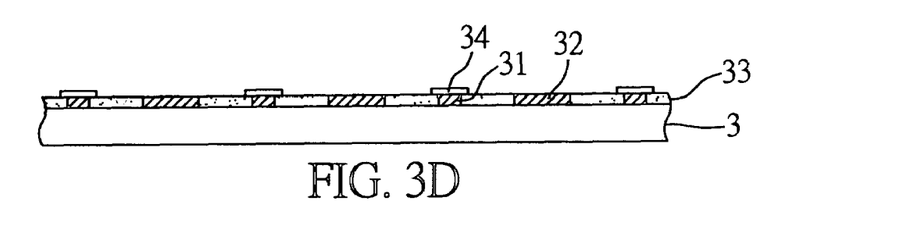

Referring to FIG. 3D, while the surface of the substrate 3 is formed with both conductive pads 32 and conductive traces 31, the surface of substrate 3 is further coated with an insulating film 34 by a printing, spin-coating, or adhering method. The insulating film 34 may be an organic or inorganic anti-oxidizing film formed by patterning techniques such as exposure and development to cover the conductive traces 31, so that the surface of each the conductive pads 32 is exposed from the surface of the substrate 3. As the outer surface of the substrate 3 is free of conductive traces 31 as shown in FIG. 3D', it is not necessary to form any insulating film 34 to mask the conductive traces 31. Alternatively, the conductive traces 31 may be formed free of masking from the insulating film 34 as shown in FIG. 3D", while the conductive traces 31 are masked by the resist layer in the subsequent electroplated pre-soldering process.

Figure 3E:
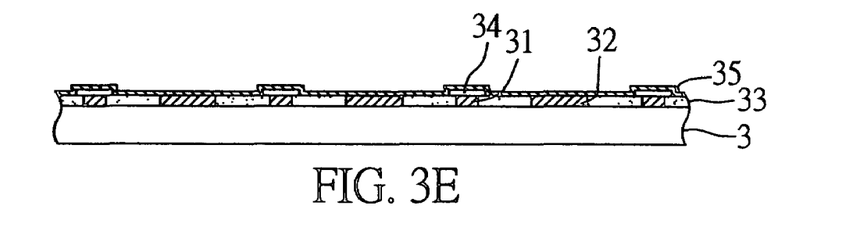

Referring to FIG. 3E, a conductive film 35 is further formed on the surface of the substrate 3, wherein the conductive film 35 serves as a main current conductive path required for subsequently electroplating the pre-soldering material. The conductive film 35 is made up of metal, alloy, or several deposited metal layers selected from a group consisting of copper (Cu), tin (Sn), nickel (Ni), chromium (Cr), titanium (Ti), Cu/Cr alloy, and Sn/Pb alloy. And the conductive film 35 is formed by methods, such as physical vapor deposition (PVD), chemical vapor deposition (CVD), electroless plating or chemical deposition, such as sputtering, evaporation, arc vapor deposition, ion beam sputtering, laser ablation deposition or plasma enhanced chemical vapor deposition (PECVD) over the substrate 3. As shown in FIG. 3E, the conductive film 35 covers the surface of the substrate 3 having the conductive pads 32 and conductive film 31 thereon, with an insulating film 34 covering the conductive traces 31. Also referring to FIG. 3E', while the outer surface of the substrate 3 is not formed with any conductive traces, the conductive film 35 is formed directly on the substrate 3 without masking from the insulating film 34. As illustrated in FIG. 3E", the substrate 3 having the conductive pads 32 and conductive film 31 thereon is covered directly with the conductive film 35 and it is not necessary to cover the conductive traces 31 with the insulating film 34. The embodiment is further described with reference to the example where the substrate has the conductive traces and conductive pads formed thereon and an insulating film is formed over the conductive traces. This example differs from others (including one having only conductive pads on the substrate shown in FIG. 3E' and one having conductive traces and conductive pads on the substrate without the insulating film on the conductive traces shown in FIG. 3E") in that the insulating film 34 is formed on the conductive traces 31 above the substrate 3.

Figure 3F:
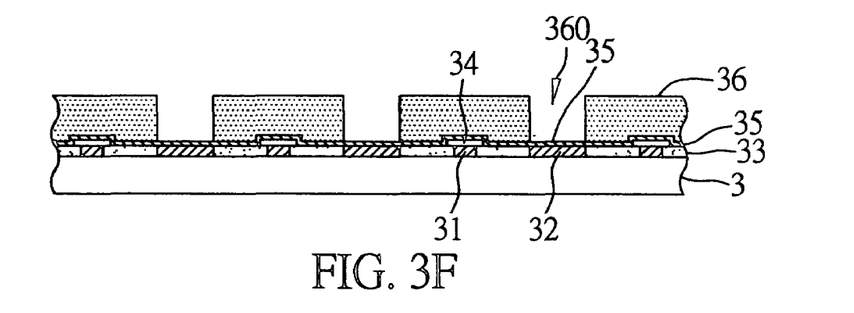

Referring to FIG. 3F, a resist layer 36 is formed by patterning on the conductive film 35 over the substrate 3, wherein a plurality of openings 360 are formed in the resist layer 36 to expose a part of the conductive film 35 on the conductive pads 32. The resist layer 36 may be a dry film or liquid state photoresist formed by methods such as printing, spin coating, and adhering over the substrate 3. Then, the resist layer 36 is patterned by exposure and development or laser technique to form openings 360 in the resist layer 36.

Figure 3G:
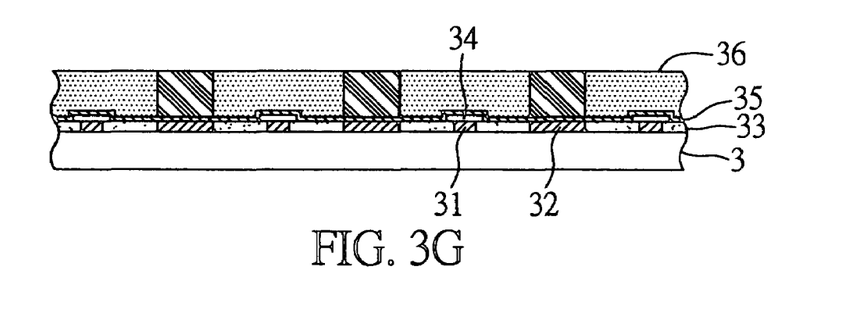

Referring to FIG. 3G, the substrate 3 is then subjected to an electroplating process. As the conductive film 35 has a conductive characteristic, it may serve as a current conductive path when the electroplating process is performed, so that pre-soldering material is deposited as a result of electroplating conductive pads 32 in the openings 360.

Figure 3H:
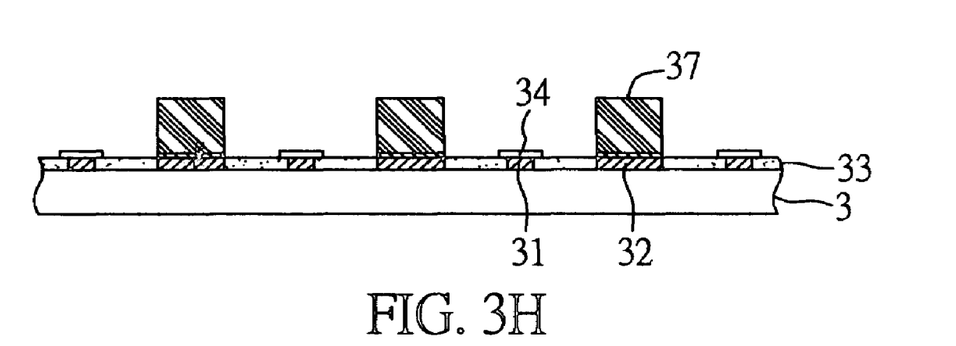

Referring to FIG. 3H, the resist layer 36 is removed after the pre-soldering material is formed on an exposed surface of the conductive pads 32. Next, the conductive film 35 covered by the resist layer 36 is removed. The pre-soldering material may be made in the form of a conductive pillar 37 to electrically connect an electrode pad of the flip-chip type semiconductor chip.

Figure 3I:
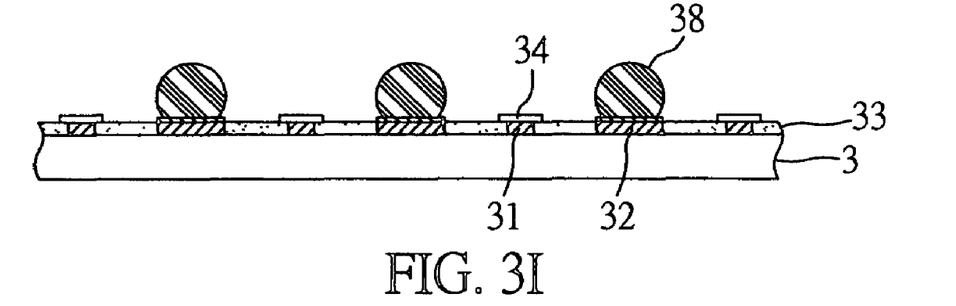

Referring to FIG. 3I, a re-flow soldering process is performed at a temperature sufficient to melt the pre-soldering material such that the pre-soldering material is re-flowed to form pre-soldering bumps 38 on the conductive pads 32. Subsequently, the pre-soldering bumps 38 adhere with the metal bumps of the semiconductor chip to form solder joints.

Figure 4A:
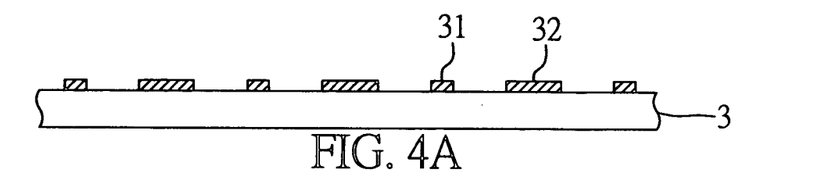
FIGS. 4A through to 4E are schematic cross-sectional views illustrating a method for fabricating a substrate for a pre-soldering material according to the present invention.

FIGS. 4A through to 4E are schematic, cross-sectional diagrams illustrating method for fabricating the substrate formed with pre-soldering material according to another preferred embodiment of the present invention, where the pre-soldering material is deposited by stencil printing on the conductive pads exposed from the substrate surface.

Referring to FIG. 4A, a semiconductor package substrate 3 is provided. The substrate 3 has a surface formed with a plurality of conductive pads 32. A plurality of conductive traces 31 may also be formed on the surface of the substrate to electrically connect with the conductive pads 32.

Figure 4B:
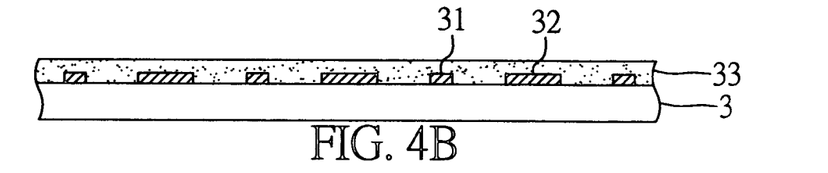

Referring to FIG. 4B, an organic insulating layer 33, preferably an organic insulating layer 33 is formed by printing, spin-coating, or adhering over substrate 3 formed with the conductive pads 32. Preferably, the insulating layer 33 may be an anti-soldering layer, such as a layer of green paint.

Figure 4C:
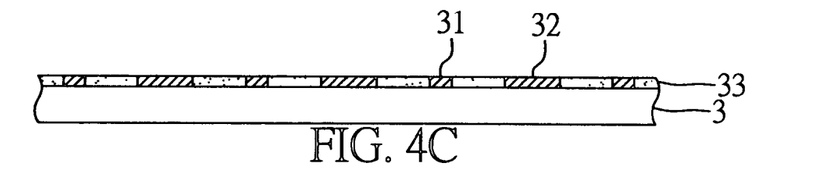

Referring to FIG. 4C, a portion of the insulating layer 33 is removed by thinning technology such as a polishing method to expose a top surface of each of the conductive pads 32, so that the insulating layer 33 closely adheres to a periphery of the conductive pads 32, while the top surface of the conductive pad 32 is completely exposed.

Figure 4D:
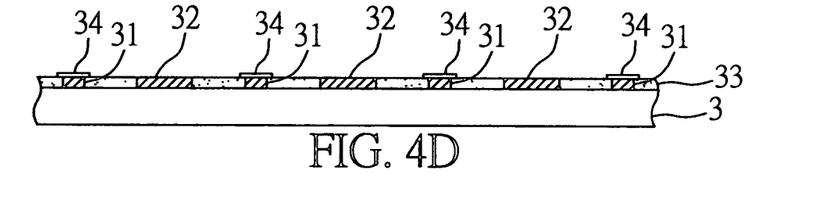

Referring to FIG. 4D, while the surface of the substrate 3 is formed with both conductive pads 32 and conductive traces 31, the surface of substrate 3 is further coated with an insulating film 34 by a printing, spin-coating, or adhering method. The insulating film 34 may be an organic or inorganic anti-oxidizing film formed by patterning techniques such as exposure and development to cover the conductive traces 31, so that the surface of each the conductive pads 32 is exposed from the surface of the substrate 3. As the outer surface of the substrate 3 is free of conductive traces 31 as shown in FIG. 4D', it is not necessary to form any insulating film 34 to mask the conductive traces 31. Alternatively, the conductive traces 31 may be formed free of masking from the insulating film 34 as shown in FIG. 4D".

Figure 4E:
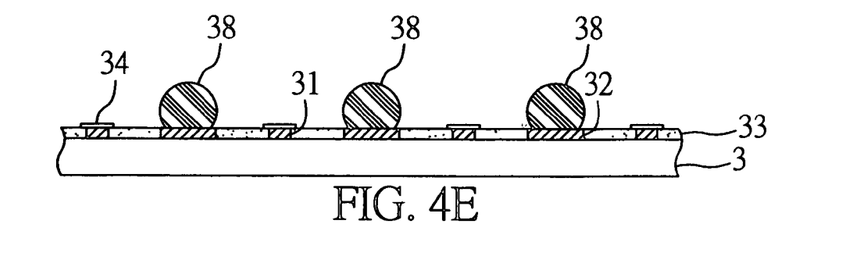

Referring to FIG. 4E, a pre-soldering material is deposited by stencil printing on the conductive pads 32. A re-flow soldering process then is performed at a temperature sufficient to melt the pre-soldering material such that the pre-soldering material is re-flowed to form pre-soldering bumps 38 on the conductive pads 32. The insulating film 34 has a thickness of about 2 to 5 μm and does not cover periphery of the conductive pads 32. So, the insulating film 34 is thin enough to enable depositing by stencil printing the pre-soldering material on the conductive pads 32, while minimizing occurrence of misalignment. Alternatively, if the substrate surface is not formed with any insulating film, the pre-soldering bumps 38 are formed by stencil printing on the conductive pad 32 having a larger contact area. Preferably, the stencil plate used in the previous stencil printing method is a steel plate.

Figure 5A:
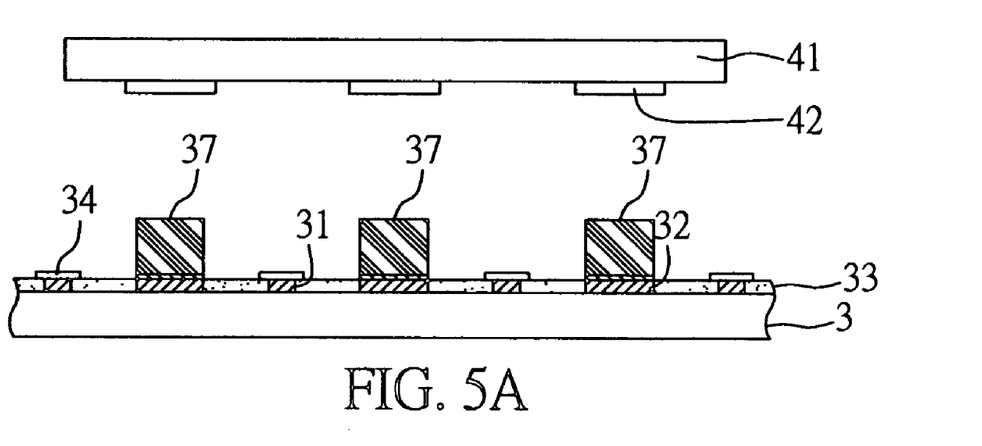
FIGS. 5A and 5B are schematic cross-sectional views illustrating adhesion of the semiconductor chip on the substrate according to the present invention.
Figure 5B:
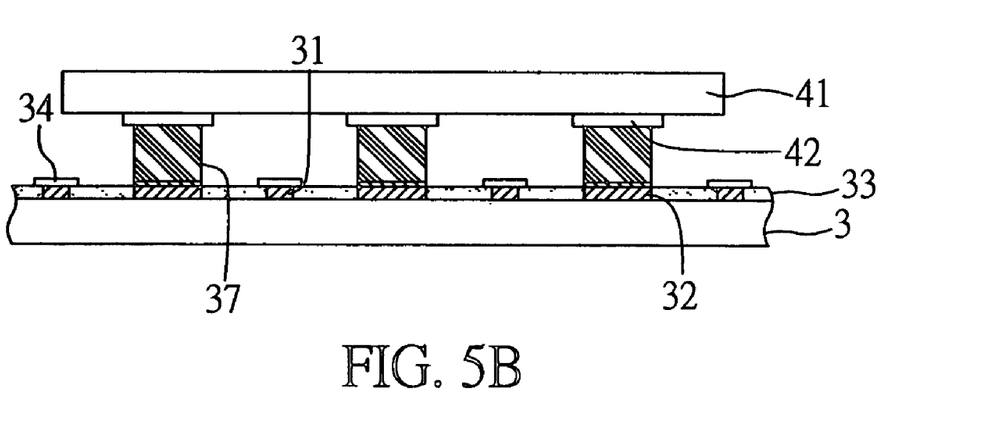

The following embodiments are described with reference to related diagrams. In one embodiment, the conductive pillars 37 formed on the conductive pads 32 of the substrate 3 can be adhered to a semiconductor chip having electrode pads. As shown in FIGS. 5A and 5B, a semiconductor chip 41 having a plurality of electrode pads 42 is provided, wherein the semiconductor chip 41 is mounted and connected to the substrate 3 by corresponding electrode pads 42 of the semiconductor chip 41 to the conductive pillars 37 of the substrate 3 with a re-flow soldering process, which is performed at a temperature sufficient to melt the pre-soldering material of the conductive pillars 37.

Figure 6A:
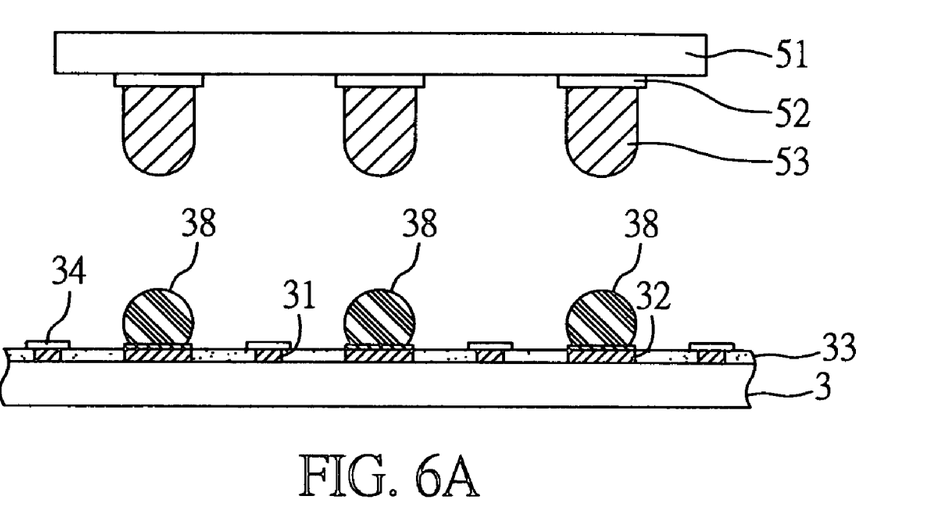
FIGS. 6A and 6B are schematic cross-sectional views illustrating adhesion of the semiconductor chip having the metal bumps on the substrate according to the present invention.
Figure 6B:
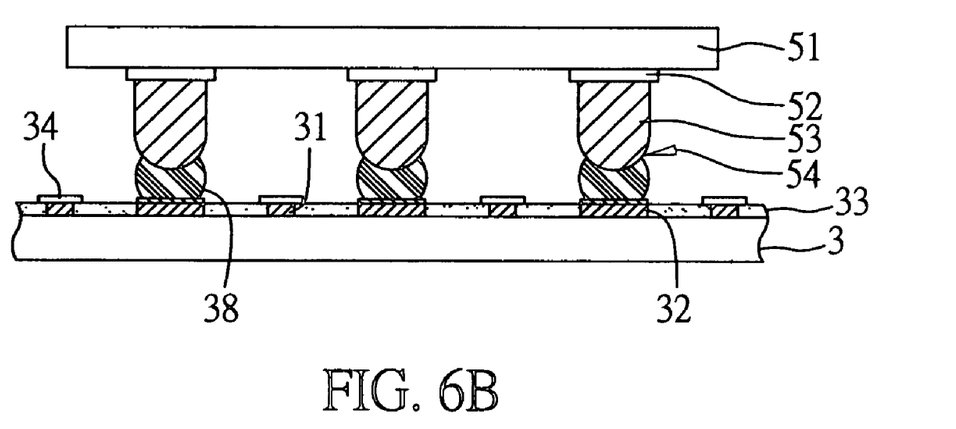

According to another embodiment, the substrate 3 adhered with semiconductor chip having metal bumps. As shown in FIG. 6A, the semiconductor chip 51 has a plurality of electrode pads 52 formed on an active surface of the semiconductor chip 51, wherein the electrode pads 52 have a plurality of metal bumps 53 thereon. The semiconductor chip 51 is mounted on the substrate 3 in such a way that the metal bumps 53 of the semiconductor chip 51 respectively corresponding to the pre-soldering bumps 38 of the substrate 3. Next, referring to FIG. 6B, the pre-soldering bumps 38 are re-flow soldered on the metal bumps 53, so as to form flip-chip solder 54 between the semiconductor chip 51 and the substrate 3. The metal bumps 53 may be made up of metal, alloy or several deposited metal layers and may include solder bumps, gold bumps, copper bumps, or copper pillars covered by solder caps. Also, the metal bumps can comprise nail shaped bumps, ball shaped bumps, pillar shaped bumps, or metal bumps in other shapes.

Figure 7A:
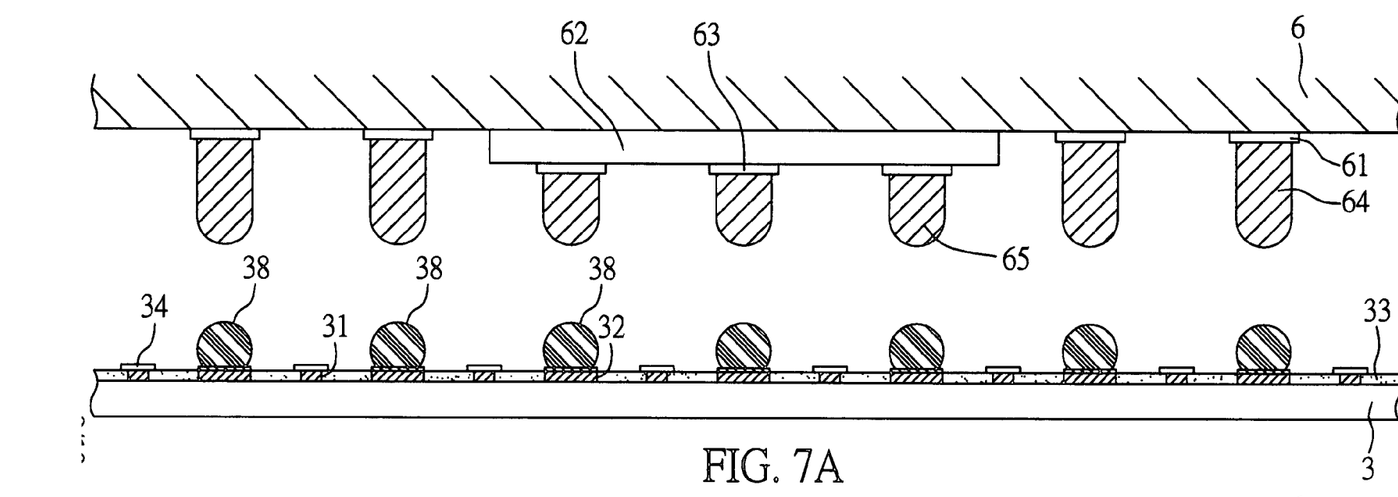
FIGS. 7A and 7B are schematic cross-sectional views illustrating adhesion of both the flip chip soldering connection and board to board soldering connection on the substrate according to the present invention.
Figure 7B:
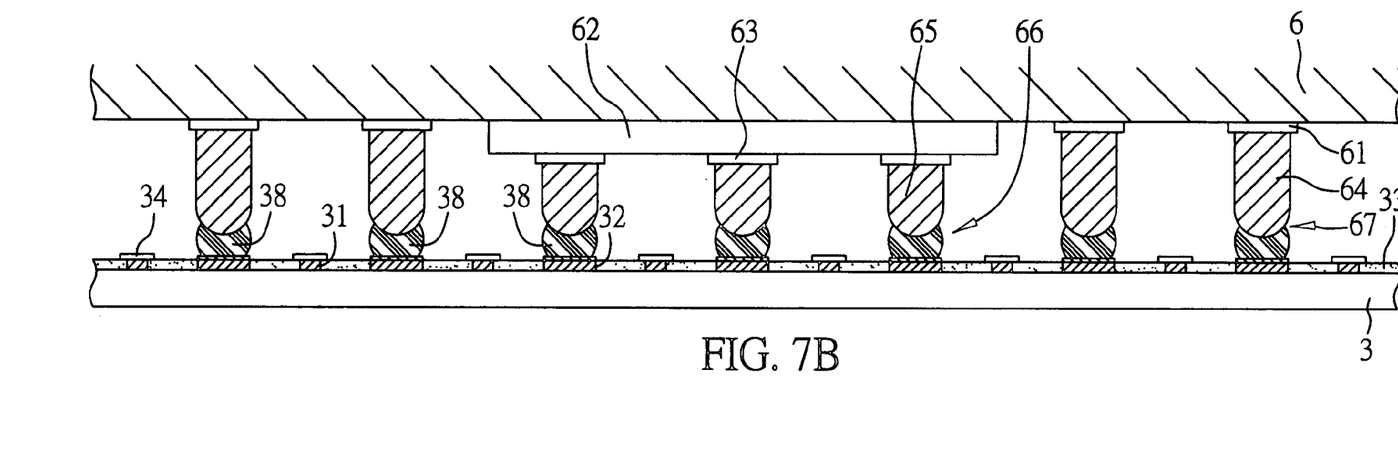

In one further embodiment, the substrate 3 is applicable to forming flip-chip pre-soldering and plate-to-plate soldering joints simultaneously. As shown in FIG. 7A, a circuit board 6 is prepared, wherein the circuit board 6 may be an organic or ceramic circuit board. The chip 62 is then placed on an appropriate location of the circuit board 6. A plurality of electrode pads 63 are formed on the chip 62, while a plurality of conductive pads 61 is formed on the circuit board 6 surrounding the chip 62. Then, a plurality of metal bumps 64, 65 is formed respectively on the conductive pads 61 and the electrode pads 63. Next, the circuit board 6 is placed in such a way as to face the metal bumps 64, 65 towards the pre-soldering bumps 38 in order to be mounted the circuit board 6 on the substrate 3. Referring to FIG. 7B, the metal bumps 64, 65 are soldered respectively to corresponding pre-soldering bumps 38, so as to form flip-chip pre-soldering joint 66 between chip 62 and substrate 3, to form soldering joint 67 between the circuit board 6 and the substrate 3.

Figure 8:
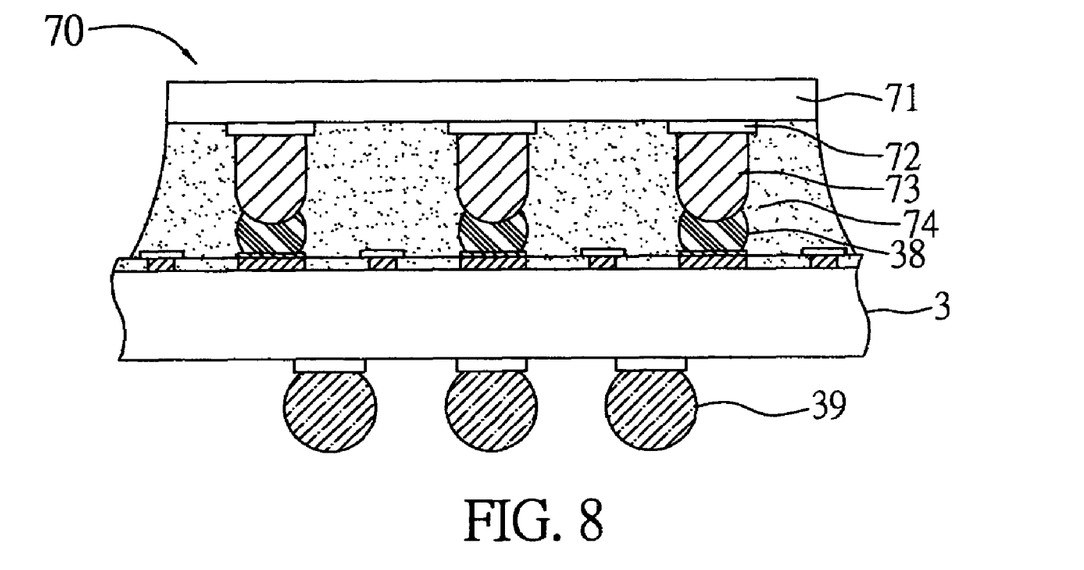
FIG. 8 is a schematic cross-sectional view illustrating the substrate for fabricating a flip-chip package according to other embodiments of the invention.

According to yet another embodiment of the present invention, the substrate 3 may be a semiconductor package substrate used to fabricate a flip-chip package 70. Referring to FIG. 8, a plurality of conductive pads is formed respectively on an upper and lower surface of the substrate 3. And with the method described above, a plurality of pre-soldering bumps 38 are formed on the conductive pads above the upper surface of the substrate 3, and a plurality of solder balls 39 are implanted on the conductive pads formed on the lower surface of the substrate 3. And a chip 71 is mounted on the substrate 3 by a flip-chip method in such a way that the metal bumps 73 are formed on the electrode pads 72 to solder with the pre-soldering bumps 38 formed on the substrate 3. A gap between the chip 71 and the substrate 3 is filled with an underfill material 74 to form the flip-chip package 70.

According to the substrate for forming the pre-soldering material and the method for fabricating the same, the upper surface of the electrode pad is exposed from the organic insulating layer, so that a larger area of the conductive pad is provided for forming the pre-soldering material. Without forming the insulating layer to occupy space which is between chip and its package substrate, the present invention can reduce the amount of pre-soldering material required as well as the thickness of the package substrate, making the semiconductor package lighter and more compact, while the fabrication cost is minimized. And as the contact area between the conductive pads and the deposited pre-soldering material is increased, the bonding strength for the pre-soldering material is enhanced.

The conductive pads described in the present invention are also applicable to bump pads, pre-soldering pads, or solder ball pads in the conventional circuit board. Although the above embodiments are illustrated with a part of the conductive pads, the actual number of conductive pads and pre-solders distributed on the package substrate depend on actual process need, and the process can be implemented to one side or both sides of the package substrate.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A fabrication method of a substrate for a pre-soldering material, comprising the steps of:
   providing the substrate having at least one surface formed with a plurality of conductive traces and conductive pads;
   forming an organic insulating layer over the surface of the substrate, conductive traces and the conductive pads, and removing a portion of the insulating layer in a manner that a top surface of each of the conductive pads is exposed from the insulating layer by thinning technology using a polishing process;
   forming an insulating film over the conductive traces;
   forming a conductive film and a resist layer in sequence over the substrate, wherein a plurality of openings are formed in the resist layer to expose a part of the conductive film above the conductive pads;
   performing an electroplating process over the substrate to deposit the pre-soldering material into the openings over the conductive pads; and
   removing the resist layer and a part of the conductive film covered by the resist layer after the pre-soldering material is deposited over the conductive pads.

2. The fabrication method of claim 1, wherein the pre-soldering material deposited in each of the openings forms a conductive pillar.

3. The fabrication method of claim 1, wherein the pre-soldering material forms as solder bumps over the conductive pads by a re-flow soldering process.

* * * * *